United States Patent [19]
Abercrombie et al.

[11] Patent Number: 5,666,063
[45] Date of Patent: Sep. 9, 1997

[54] METHOD AND APPARATUS FOR TESTING AN INTEGRATED CIRCUIT

[75] Inventors: David A. Abercrombie, Cedar Park; Whitson G. Waldo, Hutto, both of Tex.

[73] Assignee: Motorola, Inc., Schaumburg, Ill.

[21] Appl. No.: 735,472

[22] Filed: Oct. 23, 1996

[51] Int. Cl.⁶ .............................. G01R 31/00; G01R 1/06; H01R 43/00
[52] U.S. Cl. .............................. 324/754; 29/885; 430/313
[58] Field of Search .............................. 324/754; 29/885, 29/832, 835; 430/313, 315, 317

[56] References Cited

U.S. PATENT DOCUMENTS 5,172,473  12/1992  Burns et al. .............................. 29/885

Primary Examiner—Ernest F. Karlsen
Assistant Examiner—Barry C. Bowser
Attorney, Agent, or Firm—Kent J. Cooper; Keith E. Witek

[57] ABSTRACT

An apparatus and method for laser ablating residue off of probe tips. In one embodiment, the probe tips of the probe needles (16) contact the test pads of an integrated circuit on a wafer (18). The probe tips build up a residue over time. This residue is due to the probe tips coming into contact with integrated circuit wafer layers such as layers (114), (120), (122), (124), and (126). This residue can be vaporized from the surface of the probe needles via exposure to a laser light. The probe needles (16) are exposed to a laser light created by a laser source (28) and ported to the probe tips by a fiber optic cable (26).

49 Claims, 4 Drawing Sheets

METHOD AND APPARATUS FOR TESTING AN INTEGRATED CIRCUIT

FIELD OF THE INVENTION

The present invention relates generally to testing of integrated circuits and, more particularly, to cleaning probe cards using laser ablation.

BACKGROUND OF THE INVENTION

In the integrated circuit industry, integrated circuits are manufactured on semiconductor wafers. These integrated circuits must be electrically probed in order to determine that the integrated circuits are functioning properly. In order to probe an integrated circuit, the wafer is placed into a test apparatus which contains a probe card. The probe card contains conductive needles which are used to make electrical contact to exposed conductive top portions of the integrated circuits. The top surface of the integrated circuits contains both dielectric and conductive materials. Through the course of testing, the probe needles are brought into contact with the dielectric and conductive material on the top surface. Portions of this dielectric and conductive material from the top surface of the wafer will adhere to the tips of the probe needles. As this dielectric and conductive residue coats the tip of the probe needles, the contact resistance of the test interconnections increases whereby yield can decrease and integrated circuit (IC) testing can become inconsistent over time.

In order to clean the residue off of the tips of the probe needles, several prior art techniques can be used. In a first form, the probe needles can be scraped against a stone burnishing pad. While the burnishing of the probe needles against a stone pad can reduce the amount of residue formed on the tip of the probe needles, this abrasive operation has several disadvantages. First, when using a burnishing operation, portions of the probe needle are actually ground away along with the residue, thereby reducing the effectiveness and life time of the probe needles. In addition, the burnishing operation does not result in uniform cleaning of all of the probe needles which are attached to the probe card. In addition, over time, the stone burnishing pad will eventually become coated with the residue which was removed from previously-cleaned probe needles. Once this residue on the stone burnishing pad becomes significant, the effectiveness of the stone burnishing pad for removing residue on probe needles is significantly reduced. In a worst case, when the stone burnishing pad is significantly coated with residue, the stone burnishing operation can actually place more residue on the probe needles rather than remove residue from the probe needles. Due to the down pressure and lateral motion required for burnishing operations, the probe needles can be mechanically damaged or misaligned by changing their position during the burnishing process.

In another form, the prior art can replace stone burnishing with a light sandpaper clean or a camel hair brushing operation. Both of these techniques also suffer from the same disadvantages previously discussed for stone burnishing.

In another form, a chemical clean, such as an alcohol clean or other solvent clean, can be used in an attempt to reduce residue on the probe card needles. In an alcohol clean, experimentation has shown that adequate probe needle cleaning is not achieved. Regarding any solvent clean, the solvent used to remove residue on probe needles could be destructive to the material used to mount the probe needles onto the probe card and destructive to the probe card material. Therefore, use of solvent cleans could inadvertently result in significant damage to the entire probe card assembly resulting in replacement of the probe card assembly. In addition, the solvent cleans are messy, and cannot be performed in situ with the wafer testing/probing process. Solvent and alcohol cleans suffer from a significant cycle time disadvantage and throughput disadvantage when compared to other alternatives.

Therefore, a need exists for an improved method for cleaning probe needles and like integrated circuit conductive contacts.

Figure 1:
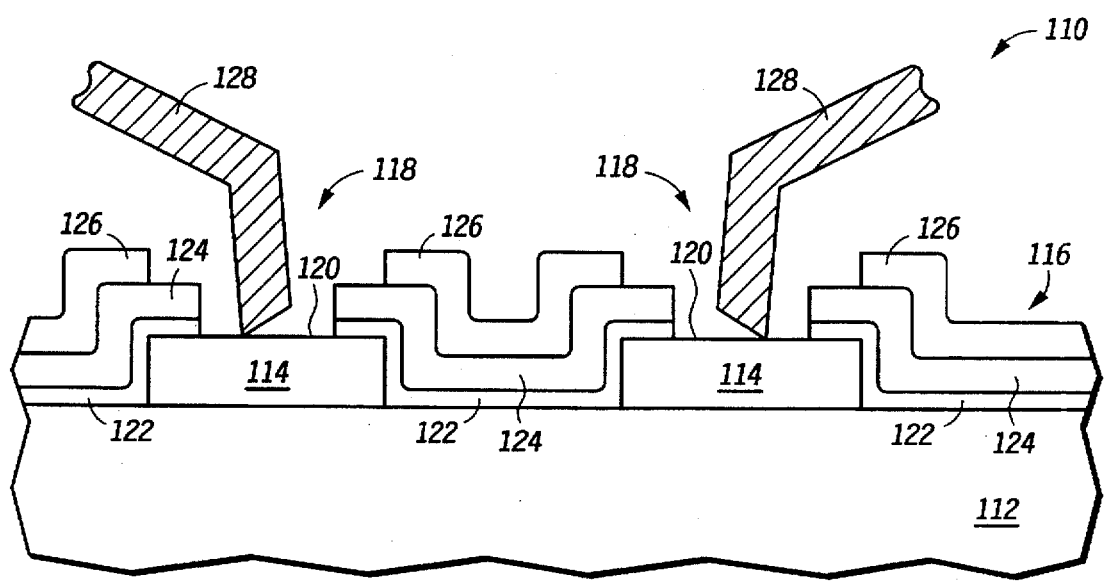
FIG. 1 illustrates, in cross sectional form, a portion of an integrated circuit being probed by probe needles in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF A PREFERRED EMBODIMENT

Generally, the present invention is an apparatus or method for cleaning probe needles or conductive layers of integrated circuits using laser ablation. Laser oblation has several advantages over the mechanical and/or chemical cleans taught in the background of the present invention. Laser ablation is an effective way to remove residue from the tips of probe needles. In addition, while effectively removing residue from probe needles, laser oblation will not wear probe needle tips over time. By not wearing the probe needle tips, the life of the probe card assembly can be increased. By changing the power, wavelength, pulse duration, number of pulses, etc., of the laser source, laser ablation can be selectively adjusted to remove specific types of material off of the probe needles without damaging or removing the native material of the probe needle. Since the laser oblation technique taught herein is not mechanically intensive or stressful, alignment and mechanical strength of the probe needles will not be adversely affected by the residue cleaning process. Unlike other prior art techniques, the laser oblation technique taught herein can be used in a clean environment (below class 10,000). Furthermore, the laser oblation cleaning process taught herein can be performed either in situ in conjunction with probing operations or off-line at a separate station. In yet another form, laser oblation can be easily performed in an off-site manner separate from probing, manufacturing, and test operations. The light source used to perform laser oblation can be centrally localized and distributed via fiber optics, mirrors, or like optical systems, to many prober systems thereby saving equipment costs. In addition, the laser oblation process is quick and effective thereby increasing throughput and yield. In addition, the laser ablation technique is environmentally safe relative to the chemical clean processes discussed in the background.

The present invention can be further understood with reference to FIGS. 1 through 7.

FIG. 1 illustrates a cross section of a top portion of a semiconductor wafer 110. Wafer 110 comprises a base portion 112. Base portion 112 can contain many different dielectric layers and conductive layers as are necessary to form electrical devices on the surface of a substrate. Base portion 112 contains metal and polysilicon interconnects between electrical devices and to electrically route these electrical devices to create a useful integrated circuit. Base portion 112 also contains all the necessary contacts and via interconnects used to route electrical signals with conductive material. On top of base portion 112 is a conductive layer 114 which is lithographically patterned and etched. In a preferred form, the conductive layer 114 is a top level of metal on an integrated circuit (IC) and is used to form exposed bond pads or test pads. Conductive layer 114 has a conductive exposed top surface 120 as illustrated in FIG. 1. A top surface of the wafer 110 is passivated using one or more passivation materials. FIG. 1 illustrates a phosphosilicate glass layer (PSG) 122, a silicon nitride layer 124, and a polyimide layer 126. It should be noted that any one of the layers 122 through 126 can be used alone or in combination to passivate a top portion of a semiconductor wafer.

FIG. 1 illustrates probe needles 128. In order to probe conductive surfaces of the wafer 110, the probe needles 128 are brought into contact with layer 114 through bond pad openings 118 of FIG. 1. The conductive layer 114 can be made of one or more of aluminum, copper, silver, gold, titanium, tungsten, metal alloys, or like metallic materials. On top of the conductive layer 114 is an exposed conductive surface 120. This exposed conductive surface 120 can contain a native metallic oxide due to exposure to the atmosphere.

In order to effectively make electrical contact between the probe needle 128 and the conductive region 114 of FIG. 1, either mechanical pressure and/or abrasion needs to be performed between the needle 128 and the conductive layer 114. This abrasive operation or vertical pressure will remove portions of the native oxide from region 120, organic residue from on top of the region 114, and/or conductive material from the layer 114 from the wafer 110 and deposit this removed material upon the probe needles 128. This conductive and dielectric residue deposited on the probe needle 128 will result in increased resistance through the probe needles over time and reduced test effectiveness. In another form, gross misalignment of the probe needles 128 can result in contact between probe needles 128 and the layers 122–126. In this case, portions of the layers 122 through 126 are usually deposited upon a tip or surface of probe needles 128. In any case, the residue formed on probe needles 128 from abrasion with any of the layers 114, 120, 122, 124, and 126 is disadvantageous and should be removed periodically from probe needles 128. Maximization of integrated circuit yield and improvement in the effectiveness of the test procedure are directly proportional to the cleanliness of the tips of the probe needles 128.

Figure 2:
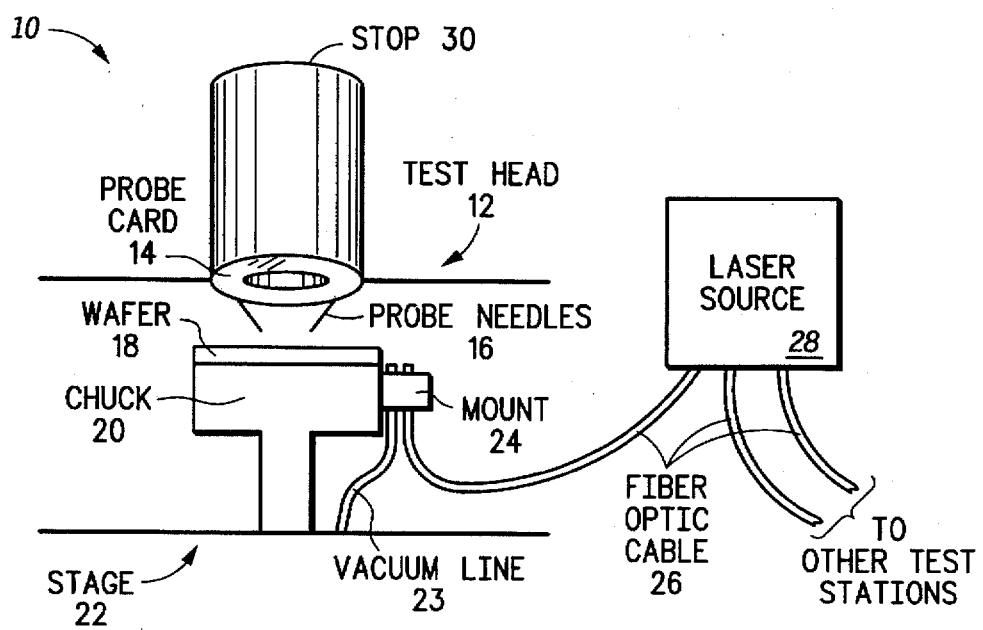
FIG. 2 illustrates, in a block diagram, a probe apparatus in accordance with the present invention.

FIG. 2 illustrates an apparatus 10 which can be used to probe a plurality of integrated circuits formed on a wafer while insuring that the probe needles of a probe card are adequately clean to insure high yield and adequate testability. The test apparatus 10 has a test head 12. Test head 12 provides mechanical stability in the test system while also providing electrical interconnections to an external test system or prober. A probe card 14 is mounted to test head 12. In most forms, the probe card 14 is attached to the test head 12 via a load board which is not illustrated in FIG. 2 for the sake of simplicity. Mounted to the probe card 14 are a plurality of probe needles 16 having probe tips. The probe needles 16 are similar to the probe needles 128 illustrated in FIG. 1. These probe needles 16, in a manner similar to the probe needles 128 of FIG. 1, are used to make electrical contact to an exposed surface of a conductive layer on a wafer.

FIG. 2 illustrates a wafer chuck 20. The chuck 20 contains a mechanism by which a wafer can be firmly fixed upon its top surface. This mechanism for affixing a wafer is typically a vacuum within the chuck 20. Chuck 20 is also coupled to X, Y, and Z motion control systems. Therefore, the chuck 20 can move up and down in FIG. 2 and in any X, Y planar direction along the surface of the probe card 14. A wafer 18 is illustrated as being mounted on chuck 20. Attached to the chuck 20 is a mechanical mount 24. Mechanical mount 24 is used to affix a vacuum line 23 and a fiber optic cable 26. The fiber optic cable 26 will selectively provide light emitted from laser light source 28 to a probe tip. This light is then used to ablate and clean the probe tip as taught herein. The vacuum line 23 is enabled to remove ablated residue from the areas surrounding the test apparatus 10 while the cleaning process is occurring. Therefore, vacuum line 23 allows for the laser ablation technique to be used in clean or semi-clean wafer fabrication environments. In non-cleanroom environments, the vacuum line 23 is optional. The laser source 28 can be a laser source dedicated specifically for a single test apparatus 10 or can be a laser source which provides laser light to a plurality of test stations, as illustrated in FIG. 2, in a time multiplexed manner. Specific workings of the laser source 28 are discussed in reference to FIG. 3. The chuck 20 is mechanically attached to a stage 22 as illustrated in FIG. 2.

Since laser light can be harmful to operators, a stop structure 30 is used to contain the laser light within the confines of the test apparatus 10, as illustrated in FIG. 2. The stop structure is any material which will stop the further progression of the laser light. When operating, the chuck 20 will move the wafer in the X, Y, and Z direction in order to place probe tips into contact with an integrated circuit on the wafer 18, as illustrated in FIG. 1. After performing test operations, the probe tips are disengaged from the wafer 18 and the chuck 20 is realigned to a new position. The chuck is then moved in the vertical direction to contact the probe tips to another integrated circuit located on the wafer 18. After probing one or more integrated circuits on the wafer 18, the probe tips begin to be coated with the residue discussed with respect to FIG. 1. The detection of this residue and determination of when the cleaning process is to occur is discussed with reference to FIG. 4. When the cleaning operation is required in the apparatus of FIG. 2, the chuck 20 will disengage the probe tips from the wafer 18. The chuck 20 will then be moved such that the fiber optic cable 26 is aligned with one or more of the probe tips. The laser source 28 is then directed to one or more of the probe tips. It should be appreciated that cleaning of the probe tips can be done in a time serial manner by computer control or manual control in order to ablate the residue on the probe tips of the probe needles 16. Chuck 20 can be computer controlled in the X and Y direction so that all the residue on the prober tips of probe needles 16 is eventually ablated by the light provided by the fiber optic cable 26. The ablation process will vaporize dielectric material and other residue material from probe tips of the tungsten probe needles 16 while not affecting the tungsten material which forms the probe needles 16. The tungsten probe needles 16 are not affected since tungsten has a higher melting point than the targeted residue. Typically, the probe needles are made of tungsten, beryllium copper, copper, tungsten alloys, or like materials. As different materials are selected for the probe needles 16, different laser light sources can need to be selected.

Although FIG. 2 illustrates a testing apparatus 10 in accordance with one embodiment of the invention, it is important to note that the laser ablation process and apparatus as illustrated in FIG. 2 can be used in many applications related to the integrated circuit industry. As illustrated in FIG. 2, the laser oblation process can be used to clean the probe tips on probe needles on any prober apparatus. In another embodiment, the laser oblation technique utilized in FIG. 2 can be used to clean connectors used to make electrical contact to packaged integrated circuit die in final test. The laser oblation technique can be used to clean conductive C4 bumps or conductive external terminals of packaged integrated circuits. The laser oblation taught in FIG. 2 can also be used on multiple die probe cards used in unit probe. Any type of probe configuration can be cleaned using laser ablation as taught herein. For instance, cobra probe needles and cantilever probe needles can both be cleaned by the laser ablation technique discussed herein.

This technique can also be used to improve electrical contacts for burn-in operations and like testing methodologies. The laser oblation technique taught herein can be used to laser oblate residue and native oxide off of bond pads just prior to rendering electrical contact. This laser oblation of bond pads allows for improved electrical contact when performing probe operations.

In another embodiment, the fiber optic cable 26 of FIG. 2 can be mounted within the testing system 10 in different manners. FIG. 2 illustrates that the fiber optic cable is mounted to the chuck 20. However, the fiber optic cable 26 can be mounted within the test head 12 and focused upon the probe card 14 and probe needles 16 via a mirror apparatus. In another form, the fiber optic cable can be mounted to the stage 22. In this embodiment, the chuck 20 will move laterally away from the probe tips exposing the probe tips to access by an underlying fiber optic cable mounted to the stage 22. A mirrored system can be used to focus the laser provided from the stage 22 to the individual probe tips as are necessary to perform a laser oblation.

The apparatus of FIG. 2 illustrates an in situ method for performing laser oblation which has throughput advantages. In another embodiment, off-line on-site laser ablation can be performed using an apparatus similar to that illustrated in FIG. 2. In an off-line on-site process, the probe card 14 is removed from the test head 12. The probe card 14 is then provided to another system which contains the laser source 28, the fiber optic cable 26 and a laser control device such as a light pen. An operator can use the light pen which is attached to the fiber optic cable to selectively provide the light source to the probe needles 16 using microscopic or like optical alignment which is either manual or automatic. In yet another form, off-line off-site laser oblation can be performed. When using this method of cleaning probe cards, the probe card 14 is removed from the test head 12. The probe card 14 is then provided to an off-site facility wherein the off-site facility will laser ablate the probe needles 16 using a stand-alone laser oblation system. This stand-alone laser oblation system will also comprise the laser source 28, the fiber optic cable 26, and a laser control device such as a light pen mounted at the end of the fiber optic cable 26. This off-site off-line station can either be manual or computer-controlled.

Figure 3:
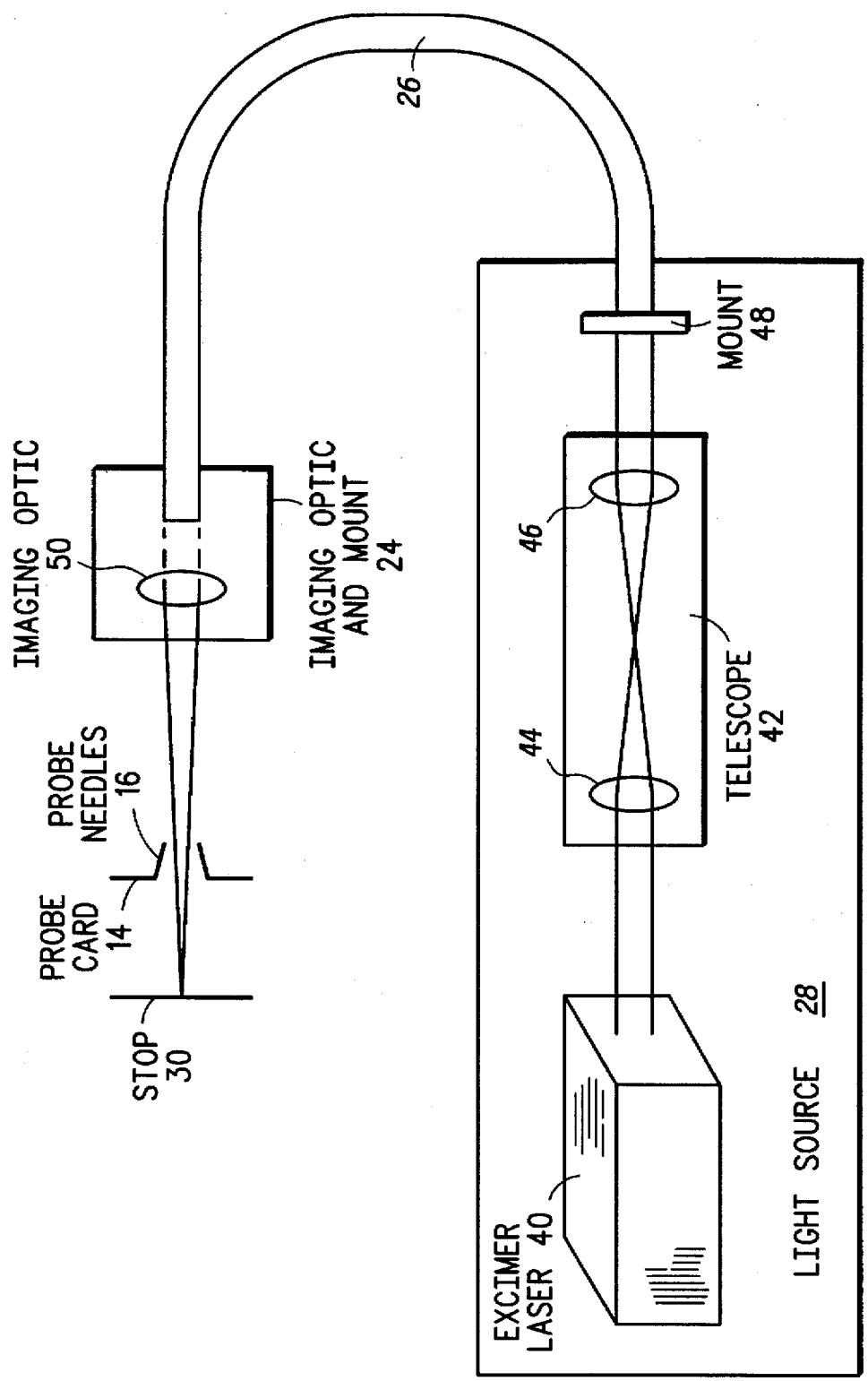
FIG. 3 illustrates, in a block diagram, a laser light source and fiber optic system for delivering laser light in accordance with the present invention.

FIG. 3 illustrates in more detail the laser source 28 illustrated in FIG. 2. The light source 28 contains one or more excimer laser sources 40. The excimer laser source 40 provides a laser light beam through a telescope 42. The telescope 42 contains optics 44 and 46 which presents the laser light through a mount 48. The mount 48 is used to mechanically align the incoming laser light to a fiber optic input of a fiber optic cable 26. The fiber optic cable is then routed to the prober as illustrated in FIGS. 2 and 3. As illustrated in FIG. 2, a single excimer laser source 40 can be used to provide laser light to one or more fiber optic cables which service separate probe stations. In order to perform this function, mechanical or optical systems can be used to allow the excimer laser 40 to be aligned to more than one optical cable 26.

The fiber optic cable 26 provides the light to the imaging optic and mount 24 as illustrated in FIG. 3 and FIG. 2. An imaging optic 50 is used to focus the light from the end of the fiber optic cable 26. Computer control is used to move the mount 24 and the imaging optic 50 so that one or more probe needles 16 are ablated at any one time or serially in time. There are many commercially available systems which can be used to provide a laser source and any of these systems can be used as the laser source 28 of FIG. 2.

Figure 4:
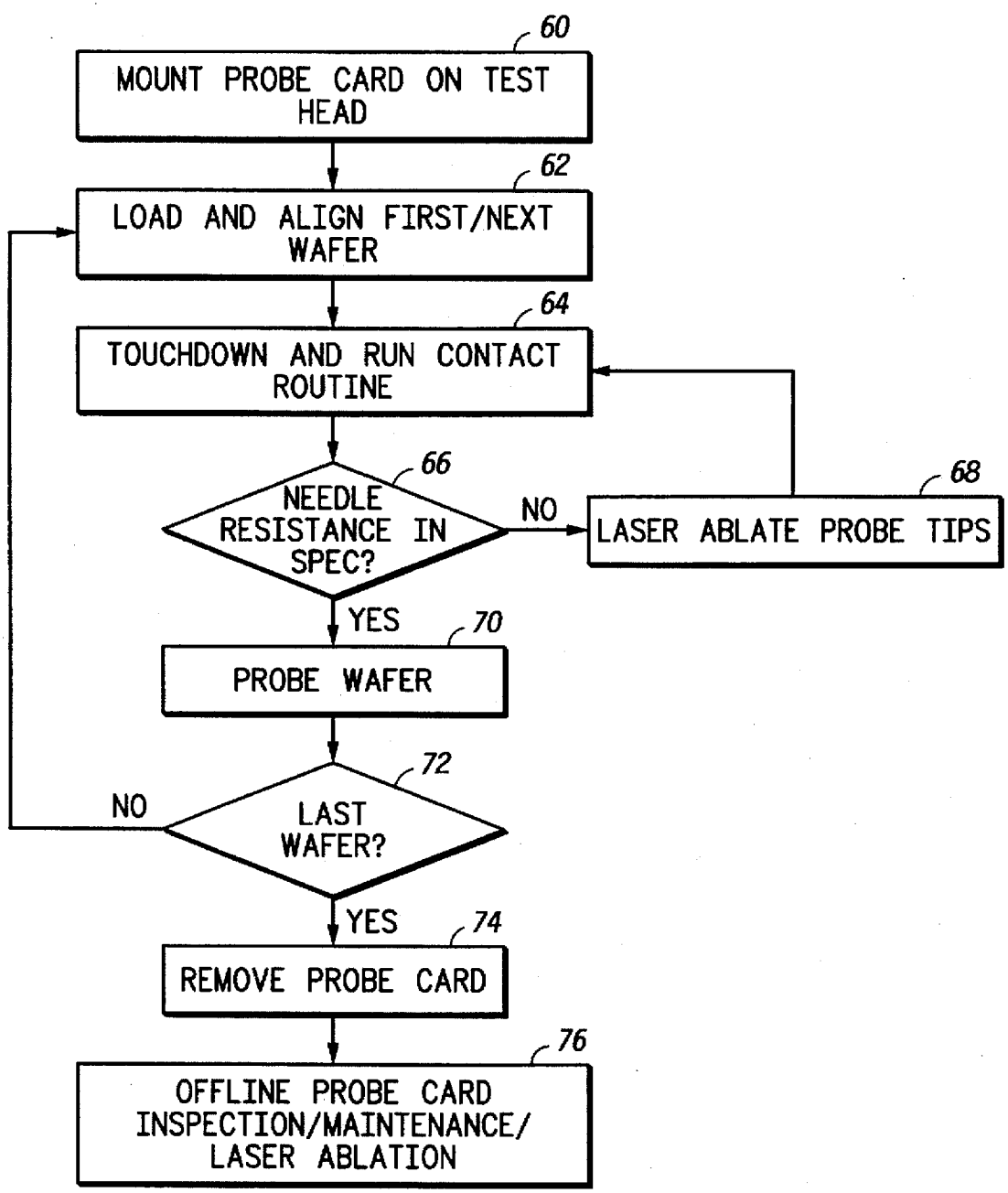
FIG. 4 illustrates, in a flow chart, a method for testing integrated circuit which includes laser ablating residue on wafer probe needles in accordance with the present invention.

FIG. 4 illustrates a typical test procedure which could be followed by an operator when probing integrated circuits on a semiconductor wafer. In a first step 60, the probe card is mounted on the test head as illustrated in FIG. 2. In a next step 62, the movable chuck 20 is used to align the probe needles 16 to a predetermined integrated circuit on the wafer 18. Using Z directional control, the chuck is vertically moved in step 64 so that the probe tips of the probe needles 16 contact the integrated circuit which was aligned in step 62. After performing probe tip-to-wafer contact in step 64, the resistance is measured in a step 66. The resistance in step 66 can be measured, in one form, by reverse biasing the input protection diodes of the integrated circuit (IC) under test. When reverse biasing these diodes, a current is created that is proportional to the contact resistance between the probe tips of the probe needles 16 and the wafer 18. If this resistance is outside of a threshold range, then a laser oblation operation is performed via step 68 of FIG. 4 to reduce resistance created by residue on the probe tips. If the resistance of the probe needles 16 are within a threshold range, the wafer is probed and tested as illustrated in step 70 of FIG. 4.

Once all the integrated circuits have been tested on one wafer, a determination is made as to whether the last wafer has been tested in a step 72. If more wafers require testing, the steps 62 through 72 are repeated until no more wafers are queued for testing. After the last wafer has been tested within the system 10 of FIG. 2, the probe card 14 can be removed from the test head 12 as illustrated via a step 74 in FIG. 4. Once the probe card 14 is removed, off-line probe card laser ablation cleaning can be performed either on-site or off-site as discussed herein and illustrated in step 76. The step 76 is part of the standard inspection, needle alignment, and probe card maintenance performed after a significant amount of wafer testing.

There are a number of methods that can be used to determine when the probe tips of the probe needles 16 need to undergo laser ablation. A first method involves cleaning the probe tips after a specified number of probe tip-to-wafer touchdowns or test measurements have occurred. A second method involves a time limit trigger wherein the ablation occurs after a set period of time. For example, the tips can be cleaned every ten minutes regardless of frequency of use. In a third method, probe yield of IC die is monitored and ablation occurs then the probe yield falls below a selected yield value. A fourth method involves monitoring a frequency of a specific failure mode (e.g., open circuit test). If this frequency exceeds a threshold, laser oblation processing is initiated. A fifth method is a visual inspection method wherein an operator determines when oblation should occur on one or more probe tips. A sixth method is when a resistance determination detects that a subset of the total number of probe needles require ablation. In this case, only the subset of probe tips which are out of specification are ablated while other needles bypass ablation for improved throughput.

Figure 5:
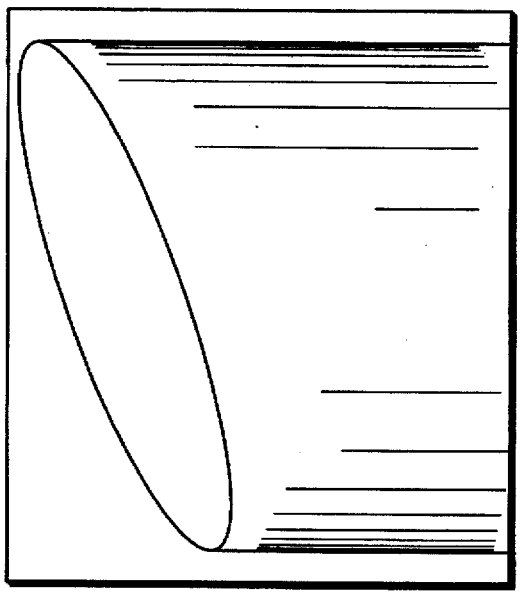
FIG. 5 illustrates, in a three dimensional illustration, a new probe needle tip used in accordance with the present invention.

FIG. 5 illustrates a cantilever probe tip which has been newly manufactured and has not been used for wafer probe. As can be seen from FIG. 5, the newly provided cantilever probe needle is in a pristine condition and does not have any residue coating it.

Figure 6:
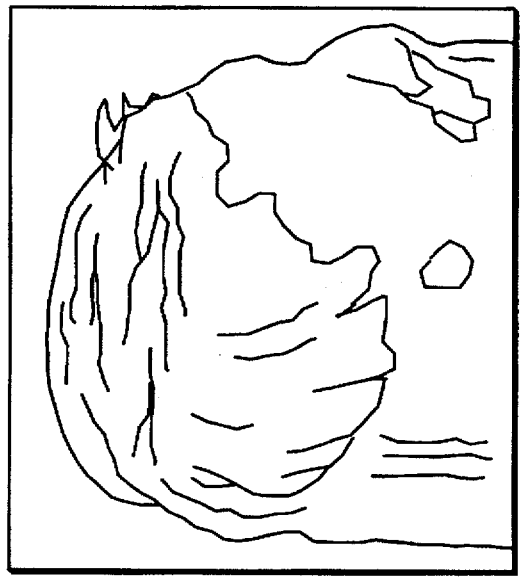
FIG. 6 illustrates, in a three-dimensional illustration, a probe needle tip coated with residue due to probing operations in accordance with the present invention.

FIG. 6 illustrates the residue which forms on the cantilever probe tip from FIG. 5 once the cantilever probe tip has been used to probe wafers as illustrated in FIGS. 1 and 2 herein. This residue illustrated in FIG. 6 contains dielectric and conductive materials deposited on the probe needle due to contact with conductive and dielectric surfaces of integrated circuits. This residue must be removed from the probe needle in order to ensure reliable testing and increased integrated circuit yield.

Figure 7:
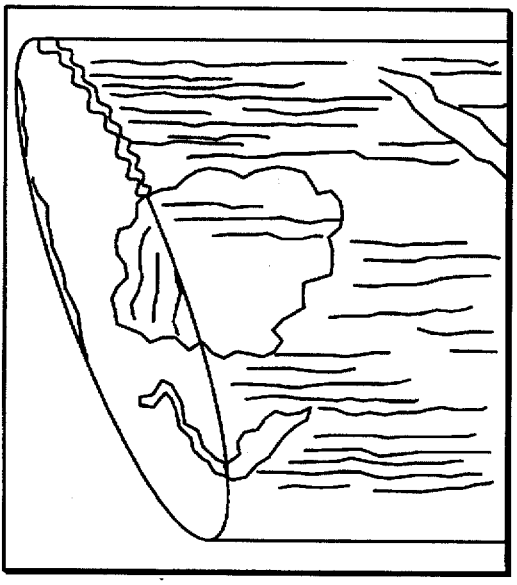
FIG. 7 illustrates, in a three dimensional illustration, the probe needle tip of FIG. 6 after being cleaned by laser ablation in accordance with the present invention.

FIG. 7 illustrates a laser ablated tip which has been laser cleaned as taught in FIGS. 1 through 4 herein. As can be seen from FIG. 7 when compared to FIG. 5, the laser ablated tip of FIG. 7 has substantially removed the residue shown in FIG. 6.

Thus it is apparent that there has been provided, in accordance with the present invention, a method and apparatus for testing integrated circuits which significantly decreases testing cycle time and significantly increases probe yield. Although the invention has been described and illustrated with reference to the specific embodiment, it is not intended that the invention be limited to these illustrative embodiments. Those skilled in the art will recognize that modifications and variations can be made with departing from the spirit and scope of the invention. Therefore, it is intended that this invention encompass all variations and modifications as fall within the scope of the appended claims.

What is claimed is:

1. A method for testing integrated circuits comprising the steps of:
   providing a first wafer having a first integrated circuit thereon;
   providing a test head;
   mounting a probe card to the test head, the probe card having a probe tip;
   placing the probe tip in contact with a first test pad to test the first integrated circuit;
   cleaning the probe tip using a laser to form a laser cleaned probe tip;
   providing a second wafer having a second integrated circuit thereon; and
   placing the laser cleaned probe tip in contact with a second test pad to test the second integrated circuit.

2. The method of claim 1, wherein the step of cleaning the probe tip is further characterized as cleaning the probe tip with an excimer laser.

3. The method of claim 1, wherein the step of cleaning the probe tip comprises the step of removing the probe card from the test head prior to cleaning the probe tip.

4. The method of claim 1, wherein the step of cleaning the probe tip is further characterized as cleaning the probe tip while the probe card is mounted to the test head.

5. The method of claim 1, wherein the step of cleaning the probe tip is further characterized as porting light emitted from the laser to the probe tip.

6. The method of claim 1, wherein the step of cleaning the probe tip is further characterized as porting light emitted from the laser to the probe tip using a fiber optic cable.

7. The method of claim 1, further comprising the step of measuring an electrical resistance of the probe tip, wherein the probe tip is cleaned when the electrical resistance of the probe tip is greater than a threshold resistance.

8. The method of claim 1, further comprising the step of measuring an electrical resistance of the probe tip, wherein the probe tip is cleaned when the electrical resistance of the probe tip is significantly different from that of a previous measurement.

9. The method of claim 1, wherein the step of cleaning is further characterized as cleaning the probe tip after the probe tip has contacted a predetermined number of test pads.

10. The method of claim 1, wherein the step of cleaning the probe tip is further characterized as cleaning the probe tip after a selected period of time.

11. The method of claim 1, further comprising the step of monitoring a probe yield, wherein the probe tip is cleaned when the probe yield is less than a selected yield value.

12. The method of claim 1, further comprising the step of monitoring a frequency of a failure mode, wherein the probe tip is cleaned when the frequency of the failure mode is greater than a selected value.

13. A method for testing integrated circuits comprising the steps of:
   providing a wafer, the wafer having a first integrated circuit and a second integrated circuit thereon,
   providing a test head;
   mounting a probe card to the test head, the probe card having a probe tip;
   placing the probe tip in contact with a first test pad to test a first integrated circuit;
   cleaning the probe tip using a laser to form a laser cleaned probe tip, wherein the probe tip is cleaned after the first integrated circuit is tested; and
   placing the laser cleaned probe tip in contact with a second test pad to test a second integrated circuit.

14. The method of claim 13, wherein the step of cleaning the probe tip is further characterized as cleaning the probe tip with an excimer laser.

15. The method of claim 13, wherein the step of cleaning the probe tip comprises the step removing the probe card from the test head prior to cleaning the probe tip.

16. The method of claim 13, wherein the step of cleaning the probe tip is further characterized as cleaning the probe tip while the probe card is mounted to the test head.

17. The method of claim 13, wherein the step of cleaning the probe tip is further characterized as porting light emitted from the laser to the probe tip.

18. The method of claim 13, wherein the step of cleaning the probe tip is further characterized as porting light emitted from the laser to the probe tip using a fiber optic cable.

19. The method of claim 13, further comprising the step of measuring an electrical resistance of the probe tip, wherein the probe tip is cleaned when the electrical resistance of the probe tip is greater than a threshold resistance.

20. The method of claim 13, further comprising the step of measuring an electrical resistance of the probe tip, wherein the probe tip is cleaned when the electrical resistance of the probe tip is significantly different from that of a previous measurement.

21. The method of claim 13, wherein the step of cleaning is further characterized as cleaning the probe tip after the probe tip has contacted a predetermined number of test pads.

22. The method of claim 13, wherein the step of cleaning the probe tip is further characterized as cleaning the probe tip after a selected period of time.

23. The method of claim 13, further comprising the step of monitoring a probe yield, wherein the probe tip is cleaned when the probe yield is less than a selected yield value.

24. The method of claim 13, further comprising the step of monitoring a frequency of a failure mode, wherein the probe tip is cleaned when the frequency of the failure mode is greater than a selected value.

25. A method for testing an integrated circuit comprising the steps of:

providing a wafer having an integrated circuit thereon;

providing a test head;

mounting a probe card to the test head, the probe card having a probe tip;

placing the probe tip in contact with a test pad to test the integrated circuit;

cleaning the probe tip using a laser to from a laser cleaned probe tip; and placing the laser cleaned probe tip in contact with the test pad to test the integrated circuit.

26. The method of claim 25, wherein the step of cleaning the probe tip is further characterized as cleaning the probe tip with an excimer laser.

27. The method of claim 25, wherein the step of cleaning the probe tip comprises the step removing the probe card from the test head prior to cleaning the probe tip with the laser.

28. The method of claim 25, wherein the step of cleaning the probe tip is further characterized as cleaning the probe tip while the probe card is mounted to the test head.

29. The method of claim 25, wherein the step of cleaning the probe tip is further characterized as porting light emitted from the laser to the probe tip.

30. The method of claim 25, wherein the step of cleaning the probe tip is further characterized as porting light emitted from the laser to the probe tip using a fiber optic cable.

31. The method of claim 25, further comprising the step of measuring an electrical resistance of the probe tip, wherein the probe tip is cleaned when the electrical resistance of the probe tip is greater than a threshold resistance.

32. The method of claim 25, further comprising the step of measuring an electrical resistance of the probe tip, wherein the probe tip is cleaned when the electrical resistance of the probe tip is significantly different from that of a previous measurement.

33. The method of claim 25, wherein the step of cleaning is further characterized as cleaning the probe tip after the probe tip has contacted a predetermined number of test pads.

34. The method of claim 25, further comprising the step of monitoring a probe yield, wherein the probe tip is cleaned when the probe yield is less than a selected yield value.

35. The method of claim 25, further comprising the step of monitoring a frequency of a failure mode, wherein the probe tip is cleaned when the frequency of the failure mode is greater than a selected value.

36. The method of claim 25, wherein the step of cleaning the probe tip is further characterized as cleaning the probe tip after a selected period of time.

37. A method for testing an integrated circuit comprising the steps of:

providing an integrated circuit, the integrated circuit having a plurality of testing pads;

providing a probe card, the probe card having a plurality of laser cleaned probe tips;

placing at least one of the plurality of laser cleaned probe tips in contact with at least one of the plurality of testing pads; and testing the integrated circuit.

38. The method of claim 37, wherein the step of providing the integrated circuit is further characterized as providing a semiconductive wafer having the integrated circuit thereon.

39. A method for testing an integrated circuit comprising the steps of:

providing the integrated circuit, the integrated circuit having a plurality of external conductive leads;

cleaning at least one of the plurality of external conductive leads using a laser;

placing the integrated circuit into a test socket, the test socket having a plurality of lead connectors; and testing the integrated circuit, wherein the at least one of the plurality of external conductive leads is cleaned prior to testing the integrated circuit.

40. The method of claim 39, further comprising the step of cleaning at least one of the plurality of lead connectors using the laser.

41. The method of claim 39, wherein the step of providing the integrated circuit, the plurality of external conductive leads are further characterized as a plurality of conductive bumps.

42. The method of claim 39, wherein the step of providing the integrated circuit is further characterized as providing a packaged integrated circuit.

43. The method of claim 39, wherein the step of cleaning is further characterized as cleaning the at least one of the plurality of external conductive leads using an excimer laser.

44. A test apparatus for testing integrated circuits comprising:

a test head;

a probe card mounted to the test head, the probe card having a plurality of probe tips; and a laser for cleaning the plurality of probe tips, wherein light emitted from the laser is selectively provided to the plurality of probe tips.

45. The test apparatus of claim 44, further comprising a fiber optic cable optically coupled to the laser, wherein the fiber optic cable ports light emitted from the laser to a location proximate to the probe card.

46. The test apparatus of claim 44, wherein the laser is further characterized as an excimer laser.

47. The test apparatus of claim 44, further comprising a wafer chuck.

48. The test apparatus of claim 45, wherein a portion of the fiber optic cable is mounted to the wafer chuck.

49. The test apparatus of claim 44, further comprising a vacuum port proximate to the probe card, wherein the vacuum port is used to remove an ablated material.

* * * * *